(12) United States Patent
Liu et al.

(10) Patent No.: US 12,126,337 B2
(45) Date of Patent: Oct. 22, 2024

(54) OPTICAL PROXIMITY SENSOR SYSTEM

(71) Applicant: ams International AG, Jona (CH)

(72) Inventors: Jian Liu, Eindhoven (NL); Klaus Schmidegg, Eindhoven (NL); Whitney Hernandez, Eindhoven (NL); Helmut Theiler, Eindhoven (NL); Josef Kriebernegg, Eindhoven (NL); George Richard Kelly, Eindhoven (NL); Matt Kroese, Eindhoven (NL)

(73) Assignee: AMS INTERNATIONAL AG, Rapperswil (CH)

( * ) Notice: Subject to any disclaimer, the term of this patent is extended or adjusted under 35 U.S.C. 154(b) by 0 days.

(21) Appl. No.: 17/427,579

(22) PCT Filed: Jan. 30, 2020

(86) PCT No.: PCT/EP2020/052345
§ 371 (c)(1),
(2) Date: Jul. 30, 2021

(87) PCT Pub. No.: WO2020/157230
PCT Pub. Date: Aug. 6, 2020

(65) Prior Publication Data
US 2022/0109442 A1 Apr. 7, 2022

Related U.S. Application Data

(60) Provisional application No. 62/829,120, filed on Apr. 4, 2019, provisional application No. 62/799,107, filed on Jan. 31, 2019.

(51) Int. Cl.
G09G 5/10 (2006.01)
H03K 17/94 (2006.01)
H03K 17/945 (2006.01)

(52) U.S. Cl.
CPC ............. *H03K 17/945* (2013.01); *G09G 5/10* (2013.01); *H03K 17/943* (2013.01);
(Continued)

(58) Field of Classification Search
CPC ................. H03K 17/94; H03K 17/943; H03K 2017/9455; H03K 2217/94108;
(Continued)

(56) References Cited

U.S. PATENT DOCUMENTS 11,126,034 B2 * 9/2021 Jiang .................... G02F 1/13338
2015/0083917 A1 3/2015 Wyrwas et al.
(Continued)

FOREIGN PATENT DOCUMENTS

CN 105359546 A 2/2016
CN 108076215 A 5/2018
(Continued)

OTHER PUBLICATIONS

KR Office Action for corresponding KR Patent Application No. 10-2021-7027846, dated Jan. 8, 2024, pp. 1-3.
(Continued)

*Primary Examiner* — Rodney Amadiz
(74) *Attorney, Agent, or Firm* — Tarolli, Sundheim, Covell & Tummino LLP

(57) ABSTRACT

An apparatus includes a display screen, and an optical proximity sensor module disposed behind the display screen. The optical proximity sensor module includes a light emitter operable to produce light having a wavelength for transmission through the display screen toward a target object, and a light sensor operable to sense light reflected by the target object and having the wavelength. The optical proximity sensor module can includes means for reducing a maximum energy density of a light beam produced by the light emitter. The means for reducing the maximum energy (Continued)

density of the light beam is disposed between the light emitter and the display screen so as to intersect the light beam produced by the light emitter. In some cases, there are multiple light emitters collectively operable to provide sufficient optical energy for proximity sensing without producing a visible spot on the display screen. These and other techniques can help reduce or eliminate display screen distortion caused by energy from the light emitters.

7 Claims, 5 Drawing Sheets

(52) U.S. Cl.
CPC .............. *H03K 2017/9455* (2013.01); *H03K 2217/94108* (2013.01); *H03K 2217/96031* (2013.01)

(58) Field of Classification Search
CPC .......... H03K 2217/96031; H03K 2217/94111; G09G 5/10
See application file for complete search history.

(56) References Cited

U.S. PATENT DOCUMENTS

| | | | |
|---|---|---|---|
| 2017/0108672 A1* | 4/2017 | Chang | G02B 5/005 |
| 2018/0212060 A1 | 7/2018 | Kang et al. | |
| 2019/0285922 A1* | 9/2019 | Sun | G02F 1/13318 |
| 2019/0363792 A1* | 11/2019 | Tsonev | G09G 3/32 |
| 2020/0019749 A1* | 1/2020 | He | G06V 40/1324 |
| 2020/0200522 A1* | 6/2020 | Huang | H01S 5/0427 |
| 2020/0370886 A1* | 11/2020 | Chen | G01S 17/88 |
| 2022/0207907 A1* | 6/2022 | Lin | G06V 40/1318 |
| 2022/0343671 A1* | 10/2022 | Michalsky | G02B 6/002 |

FOREIGN PATENT DOCUMENTS

| | | |
|---|---|---|
| CN | 108388056 A | 8/2018 |
| CN | 109141485 A | 1/2019 |
| CN | 109257470 A | 1/2019 |
| GB | 2558792 A | 7/2018 |
| JP | H09307697 A | 11/1997 |
| JP | 2004214058 A | 7/2004 |
| JP | 2008083675 A | 4/2008 |
| JP | 2009151039 A | 7/2009 |
| JP | 2015119138 A | 6/2015 |
| JP | 7530905 B2 | 8/2024 |
| KR | 20100068699 A | 6/2010 |
| KR | 20120046272 A | 5/2012 |
| KR | 20150004294 A | 1/2015 |
| KR | 20160064592 A | 6/2016 |
| TW | 1786403 B | 12/2022 |
| WO | 2018/130850 A1 | 7/2018 |

OTHER PUBLICATIONS

KR Notice of Dismissal of Amendment for KR Patent Application No. 10-2021-7027846, dated Jan. 8, 2024, pp. 1-9.
Korean Office Action for Korean application No. 10-2021-7027846, dated Feb. 7, 2023, 7 pages.
European Office Action for European application No. 20 703 012.3, dated Oct. 6, 2023, 8 pages.
JP Office Action for corresponding JP Application No. 2021-544858, mailed Dec. 26, 2023, pp. 1-6.
JP Office Action for corresponding JP Application No. 2021-544858, mailed Dec. 26, 2023, 5 pgs.
Chinese Office Action for corresponding CN application No. 202080011805.X, dated Jun. 28, 2024, 15 pages.
Japanese Notice of Grant for JP application No. 2021-544858, dated Jul. 2, 2024, 3 pages.

* cited by examiner

OPTICAL PROXIMITY SENSOR SYSTEM

RELATED APPLICATIONS

The present invention is a U.S. National Stage under 35 USC 371 patent application, claiming priority to Serial No. PCT/EP2020/052345, filed on 30 Jan. 2020; which claims priority of U.S. Provisional Application Ser. No. 62/829,120, filed on 4 Apr. 2019 and U.S. Provisional Application Ser. No. 62/799,107, filed on 31 Jan. 2019, the entirety of which are incorporated herein by reference.

FIELD OF THE DISCLOSURE

This disclosure relates to optical proximity sensing systems.

BACKGROUND

A recent trend in smartphone industrial design is to maximize the screen area by reducing the bezel width and decluttering the remaining bezel area by removing apertures for optical sensors and other holes for microphones, speakers and/or fingerprint reading devices. On the other hand, there also is a trend to increase the number of optical sensors for added functionality. For example, in some cases, an optical proximity sensor is integrated into the smartphone to facilitate adjustment of the display screen brightness and reduce the display's overall energy consumption when the user brings the smartphone close to her ear. Optical proximity sensing typically relies on emitting infra-red (IR) or near infra-red (NIR) light and measuring the light energy reflected back from the object to be detected.

A further trend in the smartphone market is the adoption of organic light emitting displays (OLEDs). This trend creates an opportunity to move the proximity sensor from the smartphone's bezel to a position under the OLED. As a result, the proximity sensor is buried behind the OLED, which allows some light, including IR and NIR radiation, to pass through. However, the energy of the IR or NIR light sometimes causes screen distortion, (e.g., a bright spot on the OLED screen which may be visible under some conditions) even when the screen displays black images.

SUMMARY

The present disclosure describes techniques for helping reduce or eliminate display screen distortion caused by energy from the light emitters in a proximity sensor module.

For example, in one aspect, the disclosure describes an apparatus that includes a display screen, and an optical proximity sensor module disposed behind the display screen. The optical proximity sensor module includes a light emitter operable to produce light having a wavelength for transmission through the display screen toward a target object, and a light sensor operable to sense light reflected by the target object and having the wavelength. The optical proximity sensor module also includes means for reducing a maximum energy density of a light beam produced by the light emitter. The means for reducing the maximum energy density of the light beam is disposed between the light emitter and the display screen so as to intersect the light beam produced by the light emitter.

Some implementations include one or more of the following features. For example, in some instances, the display screen is an OLED display screen. The means for reducing the maximum energy density of the light beam can include, for example, a microlens, a microlens array, and/or an optical diffuser. The means for reducing the maximum energy density of the light beam can be operable to cause the light beam to spread radially so as to reduce the maximum energy density of the light beam incident on the OLED screen. In some implementations, a light beam exiting the means for reducing the maximum energy density of the light beam has a larger half-beam, half-width than the light beam emitted by the light emitter. In some instances, the light emitter is operable to produce infra-red or near infra-red light.

In accordance with another aspect, the present disclosure describes an apparatus that includes a display screen, and an optical proximity sensor module disposed behind the display screen. The optical proximity sensor module includes multiple light emitters operable to produce infra-red or near infra-red light for transmission through the display screen toward a target object, and a light sensor operable to sense infra-red or near infra-red light reflected by the target object. The light emitters collectively are operable to provide sufficient optical energy for proximity sensing. In particular the light emitters spread out the optical energy for the proximity sensing, thereby reducing distortion of the display screen.

In some instances, each of the light emitters is operable to produce an energy density such that a maximum energy density of light incident on a backside of the display screen is reduced while total energy is maintained to facilitate performance for proximity sensing. The display screen can be, for example, an OLED display screen.

The present disclosure also describes a method that includes causing each of a plurality of VCSELs in an optical proximity sensor module disposed behind a display screen to produce infra-red or near infra-red light for transmission through the display screen toward a target object. Each of the VCSELs produces a maximum energy level of 2.0 mW, and preferably a maximum energy level of 1.5 mW. The method further includes sensing infra-red or near infra-red light reflected by the target object, and processing signals corresponding to the sensed infra-red or near infra-red light for proximity sensing. In some implementations, the method includes applying a driving current in a range of 2-3 mA to each of the plurality of VCSELs. Such methods can, in some cases, help eliminate or reduce screen distortion.

Other aspects, features and advantages will be readily apparent from the following detailed description, the accompanying drawings, and the claims.

DETAILED DESCRIPTION

Figure 1:
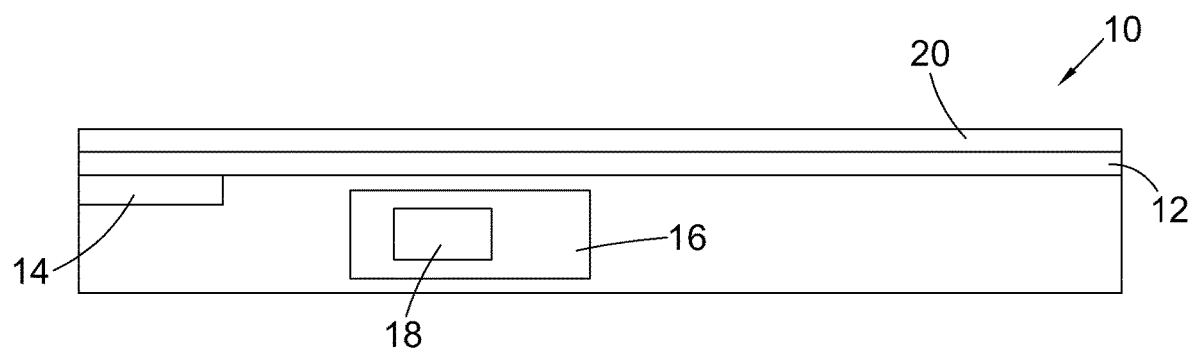
FIG. 1 illustrates various features of a host device that includes an optical proximity sensor module behind a display screen.

As shown in FIG. 1, a host device 10 such as a portable computing device (e.g., a smartphone, personal digital assistant (PDA), laptop or wearable) includes an OLED-type or other display screen 12, which can be disposed directly under a front glass 20. An optical proximity sensor module 14 is disposed directly under a portion of the display screen 12 and is operable to emit light (e.g., infra-red or near-infra-red radiation) toward a target object outside the host device 10 and to sense light reflected by the target object back toward the sensor module 14.

An electronic control unit (ECU) 16 is operable to receive, process and analyze signals from the proximity sensor module 14 and, in response, to perform a specified action depending, for example, on the amount of light detected. In some cases, for example, the ECU 16 can cause the brightness of the display screen 12 to be adjusted. In some instances, detect/release events are interrupt driven and occur when proximity result crosses upper and/or lower threshold settings. The ECU 16 can be, for example, a processor for the sensor hub or some other processor in the portable computing device 10. Overall brightness of the OLED can be controlled, for example, either by applying PWM modulation of each pixel with a transistor in series with the pixel or by the adjusting the overall range of current that can drive each pixel.

Figure 2:
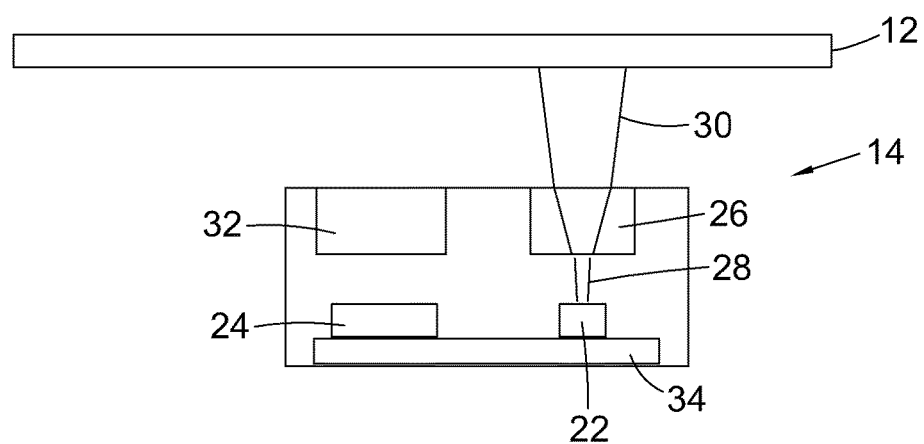
FIG. 2 illustrates details of the optical proximity sensor module according to a first implementation.

As shown in the example of FIG. 2, the proximity sensor module 14 includes an emitter 22 such as a light emitting diode (LED) or a vertical cavity surface emitting laser (VCSEL) operable to emit IR or NIR radiation (e.g., at a wavelength of 940 nm), and a factory calibrated LED driver. The proximity sensor module 14 also includes a light sensor 24 such as a photodiode receiver operable to sense light of the same wavelength emitted by the emitter 22. The photodiode receiver can include associated circuitry operable to process signals from the photodiode. Each of the light emitter 22 and photodiode receiver 24 can be implemented, for example, as respective dies (i.e., semiconductor chips) and can be mounted on a printed circuit board or other substrate 34.

Some light emitters produce a light beam whose energy density is substantially shaped like a Bell curve, that is, its energy density has a maximum value at or close to the emitter's central optical axis, and decreases with distance from the central optical axis. The maximum energy density produced by the emitter 22 may be sufficiently high so as to produce a distortion on the LED screen 12 if steps are not taken to prevent such distortion.

As further illustrated in the example of FIG. 2, the proximity sensor module 14 includes means for reducing the maximum energy density produced by the light emitter 22 and incident on the OLED screen 12. Thus, in some implementations, the proximity sensor module 14 includes a microlens or microlens array 26 disposed in the path of the beam 28 emitted by the emitter 22. The microlens or microlens array 26 intersects the beam 28 before it is incident on backside of the OLED screen 12 and causes the beam 28 to spread radially somewhat, thereby reducing the maximum energy density of the beam 30 incident on the OLED screen. Thus, in general, the microlens or microlens array 26 produces a beam 30 that is wider (e.g., a beam that has a larger half-beam, half-width) than the beam 28 produced by the emitter 22 alone. Reducing the maximum energy density of the beam 30 incident on the OLED screen 12 can reduce or eliminate screen distortion (or at least user perception of such distortion). Further, in some instances, the microlens array 26 can be implemented so as to provide a beam 30 that is more uniform. In some instances, the microlens or microlens array 26 is operable such that the light beam 30 leaving the microlens or microlens array is substantially perpendicular to the surface of the OLED display. This feature can help reduce the amount of light that may be reflected by the OLED screen 12 from impinging on the light sensor 24, thereby reducing optical cross-talk.

Figure 3C:
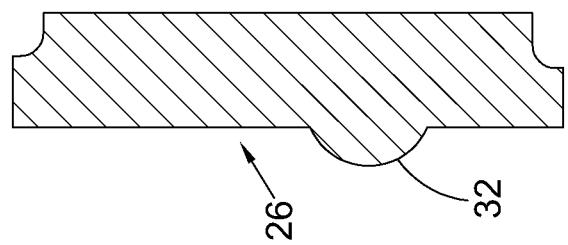
FIG. 3C is a cross-sectional view through line A-A of FIG. 3B.
Figure 3B:
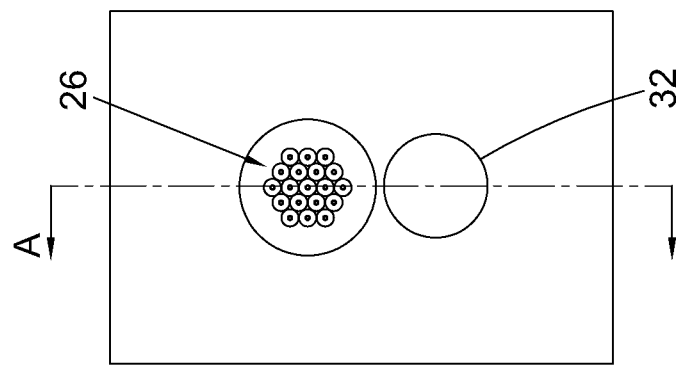
FIG. 3B is a top view of FIG. 3A.
Figure 3A:
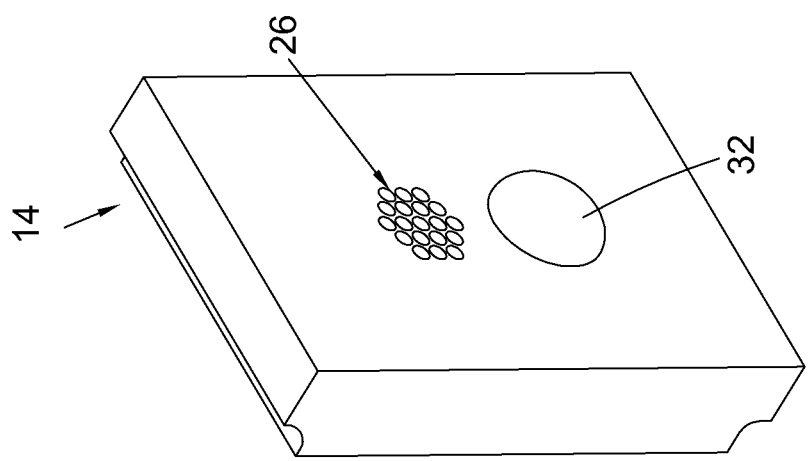
FIG. 3A illustrates further details of the proximity sensor of FIG. 2 according to some implementations.
Figure 4:
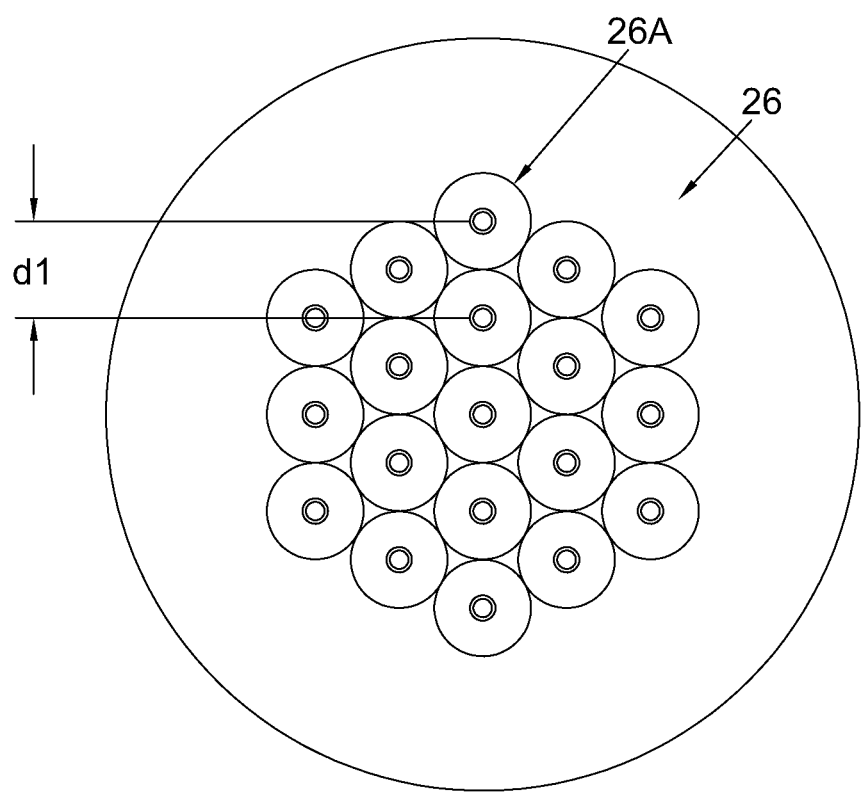
FIG. 4 illustrates a first example of a microlens array.
Figure 5:
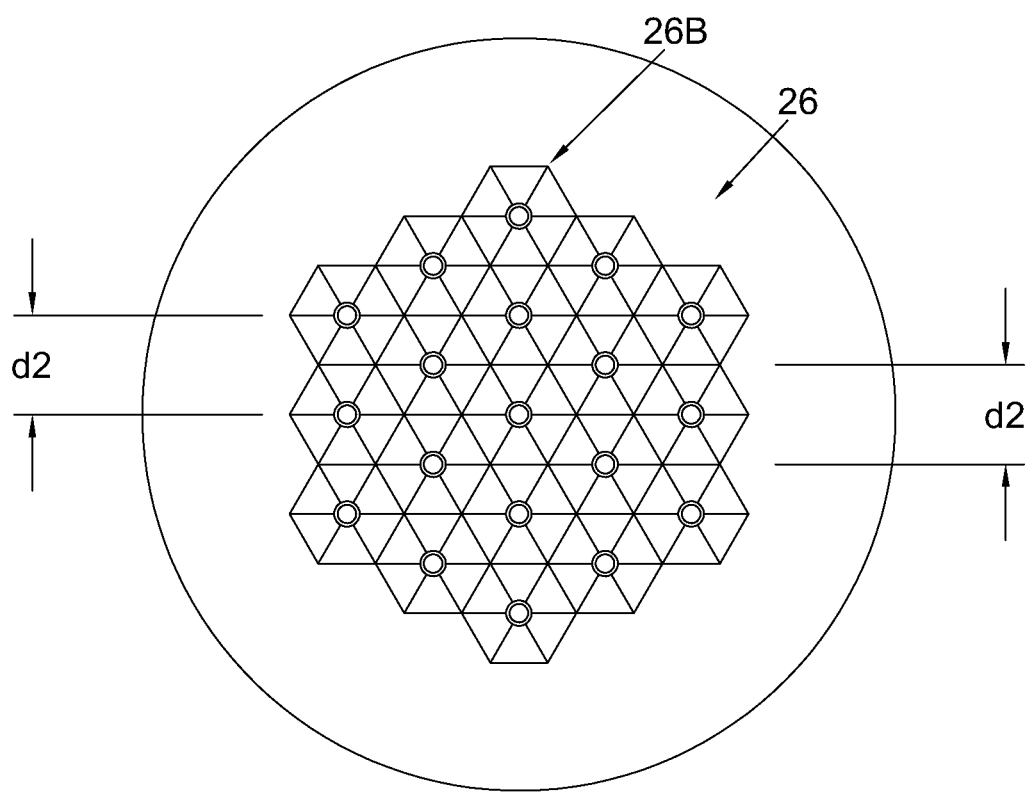
FIG. 5 illustrates a second example of a microlens array.

FIGS. 3A through 3C illustrate further details of the proximity sensor module 14 according to some implementations. The microlens array 26 in some cases covers an area of about 480 μm$^2$ directly over the emitter 22. Different areas for the microlens array 26 may be appropriate for other implementations. FIG. 4 illustrates a particular example of a microlens array 26, which includes circular microlenses 26A arranged at a pitch d1. In some instances, the pitch d1 equals 95 μm, although different values may be appropriate for other implementations. FIG. 5 illustrates another example of a microlens array 26, which includes hexagonal microlenses 26B arranged at a pitch d2. In some instances, the pitch d2 equals 95 μm, although different values may be appropriate for other implementations.

In some implementations, the means for reducing the maximum energy density includes an optical diffuser instead of, or in addition to, the microlens or microlens array.

As further shown in FIGS. 2 and 3A-3C, the module 14 also can include an optical element 32 such as a lens over the light sensor 24 and operable to direct incoming light (e.g., light reflected by the target object) toward the light sensing element(s) of the sensor 24. Providing such an optical element 32 can help improve sensitivity and noise rejection.

Figure 6:
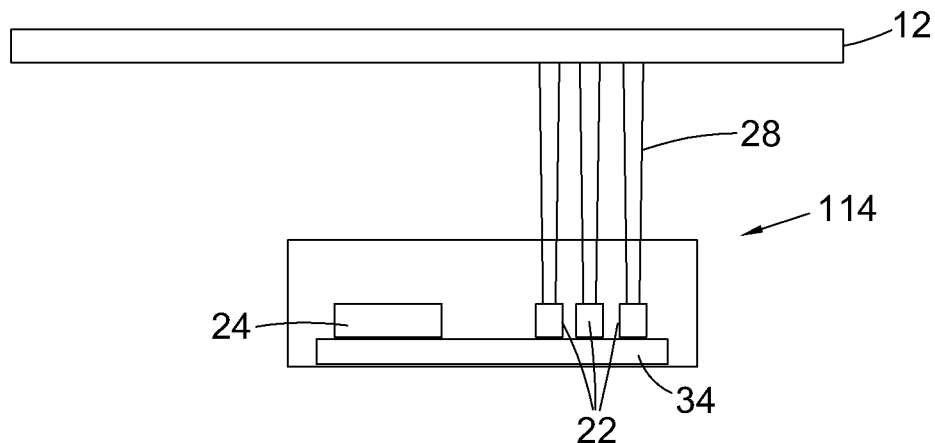
FIG. 6 illustrates details of the optical proximity sensor module according to a second implementation.

In some implementations, as shown in the example of FIG. 6, multiple light emitters 22 are provided in a proximity sensor module 114 and are disposed relative to one another so as to spread out the resulting light spot incident on the OLED screen 12. In this case, each of the emitters 22 is operable to produce a lower maximum energy density so that the density of IR or NIR light incident on the back of the OLED screen 12 is reduced while the total energy is maintained to achieve satisfactory performance for proximity sensing. For example, in some instances, instead of applying a current of 15 mA to each VCSEL light emitter 22, a current of 5 mA is applied. Different current values may be appropriate for other implementations. In some instances, a maximum optical energy density of 3 mW/mm$^2$ is incident on the back of the OLED screen 12. In some cases, each VCSEL is operated so as to produce a maximum energy level of about 2.0 mW and preferably a maximum energy level of about 1.5 mW (corresponding to about 2-3 mA of driving current for some VCSELs) to prevent screen distortion. Further, although the example of FIG. 6 shows three emitters 22, other implementations may use only two emitters or may use more than three emitters. In any event, the multiple emitters 22 are used to provide sufficient optical energy for proximity sensing without concentrating the light energy in the same area such that the OLED screen pixels are adversely affected (e.g., so as to avoid producing a spot on the OLED screen that is visible to the unaided human eye, or so as to reduce distortion that otherwise might occur).

Figure 7:
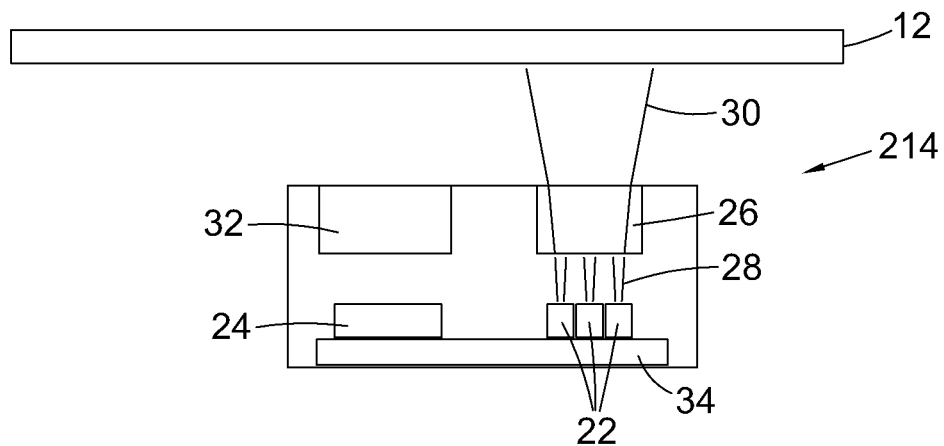
FIG. 7 illustrates details of the optical proximity sensor module according to a third implementation.

FIG. 7 illustrates an example that combines the techniques of FIGS. 2 and 3. Thus, the proximity sensor module 114 includes means 26 for reducing the maximum energy density (e.g., a microlens, a microlens array or a diffuser) as described in connection with FIGS. 2-5, as well as multiple light emitters 22 as described in connection with FIG. 6.

The design of smart phones and other host computing devices referenced in this disclosure can include one or more processors, one or more memories (e.g. RAM), storage (e.g., a disk or flash memory), a user interface (which may include, e.g., a keypad, a TFT LCD or OLED display screen, touch or other gesture sensors, a camera or other optical sensor, a compass sensor, a 3D magnetometer, a 3-axis accelerometer, a 3-axis gyroscope, one or more microphones, etc., together with software instructions for providing a graphical user interface), interconnections between these elements (e.g., buses), and an interface for communicating with other devices (which may be wireless, such as GSM, 3G, 4G, CDMA, WiFi, WiMax, Zigbee or Bluetooth, and/or wired, such as through an Ethernet local area network, a T-1 internet connection, etc.).

Various aspects of the subject matter and the functional operations described in this specification can be implemented in digital electronic circuitry, or in computer software, firmware, or hardware, including the structures disclosed in this specification and their structural equivalents, or in combinations of one or more of them. Thus, aspects of the subject matter described in this specification can be implemented as one or more computer program products, i.e., one or more modules of computer program instructions encoded on a computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The apparatus can include, in addition to hardware, code that creates an execution environment for the computer program in question, e.g., code that constitutes processor firmware.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Computer readable media suitable for storing computer program instructions and data include all forms of non volatile memory, media and memory devices, including by way of example semiconductor memory devices, e.g., EPROM, EEPROM, and flash memory devices; magnetic disks, e.g., internal hard disks or removable disks; magneto optical disks; and CD ROM and DVD-ROM disks. The processor and the memory can be supplemented by, or incorporated in, special purpose logic circuitry.

While this specification contains many specifics, these should not be construed as limitations on the scope of the invention or of what may be claimed, but rather as descriptions of features specific to particular embodiments of the invention. Certain features that are described in this specification in the context of separate embodiments can also be implemented in combination in a single embodiment. Conversely, various features that are described in the context of a single embodiment can also be implemented in multiple embodiments separately or in any suitable sub-combination. Moreover, although features may be described above as acting in certain combinations and even initially claimed as such, one or more features from a claimed combination can in some cases be excised from the combination, and the claimed combination may be directed to a sub-combination or variation of a sub-combination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing may be advantageous.

A number of implementations have been described. Nevertheless, various modifications may be made without departing from the spirit and scope of the invention. Accordingly, other implementations are within the scope of the claims.

The invention claimed is:

1. An apparatus comprising:
a display screen; and
an optical proximity sensor module disposed behind the display screen, the optical proximity sensor module including:
a plurality of light emitters configured to produce infra-red or near infra-red light for transmission through the display screen toward a target object, and further configured to produce an energy density such that a maximum energy density of light incident on a backside of the display screen is reduced while total energy is maintained to facilitate performance for proximity sensing; and
a light sensor operable to sense infra-red or near infra-red light reflected by the target object,
wherein the plurality of light emitters collectively are configured to provide sufficient optical energy for proximity sensing, the light emitters spreading out the optical energy for the proximity sensing, thereby reducing distortion of the display screen.

2. The apparatus of claim 1 wherein the display screen is an OLED display screen.

3. The apparatus of claim 1 wherein the plurality of light emitters includes a plurality of Vertical Cavity Surface Emitting Lasers each of which is operated so as to produce a maximum energy level of 2.0 mW.

4. The apparatus of claim 1 wherein the plurality of light emitters includes a plurality of Vertical Cavity Surface Emitting Lasers each of which is operated so as to produce a maximum energy level of 1.5 mW.

5. A method comprising:
causing each of a plurality of Vertical Cavity Surface Emitting Lasers (VCSELs) in an optical proximity sensor module disposed behind a display screen to produce infra-red or near infra-red light for transmission through the display screen toward a target object, wherein each of the plurality of VCSELs produces a maximum energy level of 2.0 mW;

sensing infra-red or near infra-red light reflected by the target object; and processing signals corresponding to the sensed infra-red or near infra-red light for proximity sensing.

6. The method of claim 5 wherein each of the plurality of VCSELs produces a maximum energy level of 1.5 mW.

7. The method of claim 5 including applying a driving current in a range of 2-3 mA to each of the plurality of VCSELs.

* * * * *